United States Patent
Hongo et al.

(10) Patent No.: US 6,517,689 B1
(45) Date of Patent: Feb. 11, 2003

(54) PLATING DEVICE

(75) Inventors: Akihisa Hongo, Tokyo (JP); Kenichi Suzuki, Tokyo (JP); Atsushi Chono, Tokyo (JP); Mitsuo Tada, Tokyo (JP); Akira Ogata, Tokyo (JP); Satoshi Sendai, Tokyo (JP); Koji Mishima, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/463,019

(22) PCT Filed: Jul. 9, 1999

(86) PCT No.: PCT/JP99/03729

§ 371 (c)(1),
(2), (4) Date: Jan. 19, 2000

(87) PCT Pub. No.: WO00/03074

PCT Pub. Date: Jan. 20, 2000

(30) Foreign Application Priority Data

Jul. 10, 1998 (JP) ............................ 10-195932
Jul. 16, 1998 (JP) ............................ 10-202270

(51) Int. Cl.⁷ ............................ B23H 3/02; B23H 7/04; B23H 7/14; C25B 15/00; C25B 9/00
(52) U.S. Cl. ................................ 204/228.7; 204/229.8; 204/297.14
(58) Field of Search .................... 204/229.8, 230.8, 204/228.1, 224 R, 297.05, 297.14, 228.7; 205/133

(56) References Cited

U.S. PATENT DOCUMENTS

| | | | |
|---|---|---|---|
| 4,461,690 A | | 7/1984 | Rolff et al. |
| 4,479,980 A | * | 10/1984 | Acosta et al. ............... 204/406 |
| 4,642,173 A | | 2/1987 | Koziol et al. |
| 6,001,235 A | * | 12/1999 | Arken et al. ................ 204/212 |
| 6,004,440 A | * | 12/1999 | Hanson et al. .............. 204/279 |
| 6,071,388 A | * | 6/2000 | Uzoh ..................... 204/297 R |
| 6,071,399 A | * | 6/2000 | Van der Bergen et al. .. 205/337 |
| 6,139,712 A | | 10/2000 | Patton et al. |
| 6,156,167 A | | 12/2000 | Patton et al. |
| 6,179,983 B1 | * | 1/2001 | Reid et al. .................. 204/227 |

FOREIGN PATENT DOCUMENTS

JP          5-320977          12/1993

* cited by examiner

Primary Examiner—Nam Nguyen
Assistant Examiner—Wesley A. Nicolas
(74) Attorney, Agent, or Firm—Wenderoth, Lind & Ponack, L.L.P.

(57) ABSTRACT

The present invention is to provide a conduction detection device that can detect electrical conductivity (contact condition) of feeding contacts with conductive layers of a substrate. The present invention also provides an electroplating apparatus, which is able to produce uniform currents to flow through each of feeding contacts. The apparatus has a plating vessel, in which an electrode is disposed opposite to a substrate which is affixed to a plating jig electrically through a plurality of feeding contacts for applying a specific voltage between the electrode and conductive layers provided on a plating surface of the substrate. Plating current flows from the plating jig through the feeding contacts to the substrate. A conduction detection device is provided to detect electrical conductive states between the plurality of feeding contacts and the conductive layer on the substrate.

29 Claims, 12 Drawing Sheets

PRIOR ART

PRIOR ART

PLATING DEVICE

TECHNICAL FIELD

The present invention relates to an electroplating apparatus for depositing a plated film on a substrate such as semiconductor wafer, and in particular to a plating apparatus which is capable for producing a plated film of uniform thickness.

BACKGROUND ART

In recent years, electroplating methods have been adopted for filling the fine trenches and holes, fabricated on an object such as semiconductor wafer, with metallic plating such as copper to provide circuit interconnections. One such conventional plating apparatus is known as a facedown type plating apparatus. FIG. 1 illustrates basic layout of this apparatus 10 comprised by: a plating vessel 101; an object 12 to be plated whose surface to be plated is placed face-down in the upper region of the plating vessel 101; a plating solution Q; a solution storage tank 103; a circulation pump 104 for ejecting the plating solution Q from the bottom of the plating vessel 101 through a plating solution supply pipe 105 at right angles towards the plating surface of the substrate 12.

Plating solution Q overflowing from the plating vessel 101 is collected in the solution recovery trough 106. A specific voltage is applied between the anode 107 and the plating jig 11 fastening the substrate 12 to serve as the cathode, so that the plating current flows between the anode 107 and the substrate 12 to form a plated film on the plating surface.

FIG. 2 is a cross sectional view of a portion of the feeding section of the plating jig 11.

As shown in this diagram, the plating jig 11 fastening the substrate 12 such as semiconductor wafer is placed opposite to the anode 107 in the plating vessel 10 containing the plating solution Q. A direct current voltage is applied between the plating jig 11 and the anode 13 by the plating power supply 14 for flowing plating current to form a plated film on the substrate 12.

Plating jig 11 has a feeding section which has feeding contacts 15 to contact the conductive part of the plating surface of the substrate 12, and when the contact points and the plating power supply are electrically connected, plating current flows from the plating power supply via the anode, the substrate and the contact points.

As shown in the diagram, the plating feeding section is comprised of a ring frame 17 which has a ring packing 18 on the inner periphery thereof and a feeding ring 19 which has a series of feeding contacts (or contact points) 15 spaced at a given distance along the periphery of the ring 19. The ring 19 and contacts 15 are located at the inside of the ring packing 18. The tip of the feeding contact 15 touches outer periphery of the substrate 12 where a conductive layer(not shown) is formed thereon. Then electrical contact between the conductive layer to be plated and the feeding contact 15 is formed. The tip of the packing 18 is pressed against the surface of the substrate 12 to form a tight seal so as to prevent the plating solution from entering into the inside of the packing 18. Therefore, the feeding contact 15 and the feeding ring 19 are prevented from being exposed to the plating solution.

FIGS. 3 and 4 show the conventional arrangement of feeding contact 15 attached on the feeding ring 19, respectively. In FIG. 3, feeding contacts 15 are provided at certain spacing on the feeding ring 19. While in FIG. 4, the feeding ring 19 is divided by insulators 20 into a plurality of electrically isolated sections (four sections in the example) and the feeding contacts 15 are attached to each of the divided sections of the feeding ring 19.

As shown in FIG. 3, according to the arrangement of a plurality of feeding contacts 15 attached on a common feeding ring 19, contact resistance of each feeding contact 15 varies from point to point, such that some of the feeding contacts 15 can pass current readily while others can not pass current easily. It cause a problem that plating thickness tends to be thinner at places nearby where those feeding contacts 15 can pass less current than other feeding contacts.

Also, as shown in FIG. 4, according to the arrangement of the feeding section 19 which is divided into a plurality of feeding sections separated by insulators 20 with feeding contacts 15 respectively, current in each feeding contact 15 can be controlled so that the differences of currents among the feeding contacts 15 can be minimized. However, the plating current is difficult to flow at the place between the feeding contacts 15 through the plating solution, resulting a problem that thinner plating thickness tends to be obtained in such regions of the plating surface.

DISCLOSURE OF INVENTION

The present invention is provided to solve the problems outlined above, so that an object of the present invention is to provide a plating apparatus having conduction detection means to enable detection of contact states (contact conditions) of the plurality of feeding contacts touching the substrate through the conduction detection sections so as to control the uniformity of the plating current flowing through the feeding contacts, and thereby obtaining uniform plating thickness on the substrate.

To achieve this object, there is provided an electroplating apparatus having a plating vessel for positioning an electrode in opposition to a substrate electrically affixed to a plating jig through a plurality of feeding contacts for impressing a specific voltage between the electrode and conductive layers provided on a plating surface of the substrate, thereby flowing a plating current from the electrode to the substrate through the feeding contacts so as to deposit a plated film on the substrate, wherein a feature is that a conduction detection device is provided to detect electrical conductivity properties between individual feeding contacts of the plating jig and the conductive layers on the substrate.

Also, it is preferable that the conduction detection device be provided with a plating current detection device to detect flow of electrical current through individual feeding contacts, so as to determine electrical conductivity of individual feeding contacts according to respective values of current flow detected by the plating current detection device.

Further, it is preferable that the conduction detection device be provided with a contact resistance measuring device to measure contact resistance between a conductive layer on the plating surface of the substrate and individual feeding contacts so as to determine electrical conductivity properties of respective feeding contacts according to respective values of contact resistance measured by the contact resistance measuring device.

Accordingly, because a conduction detection device is provided to determine electrical conductivity properties of each contact point of the plurality of feeding contacts, it is possible to confirm the state of conduction of plating current through each feeding contact, thereby eliminating one reason for producing non-uniform thickness of plated film.

Also, because the apparatus is provided with a plating current detection device and a plating current control device so that current flow through individual feeding contacts can be adjusted individually, it is possible to deposit a plated film of a uniform thickness on the plating surface of the substrate.

Also, in the electroplating apparatus of the present invention, each feeding contact may be made in a form of teeth contact to touch the conductive layer on the plating surface. Such a shape of the feeding contact enables to produce relatively uniform contact pressures on the conductive layers so as to generate uniform conduction states of electrical contacts, thereby enabling to deposit a uniform thickness of plated film in the vicinity of individual feeding contacts. Also, by adjusting the current flowing between the various contact points suitably, it is possible to obtain a uniform thickness of plated film over the entire plating surface of the substrate.

BEST MODE FOR CARRYING OUT THE INVENTION

Figure 1:
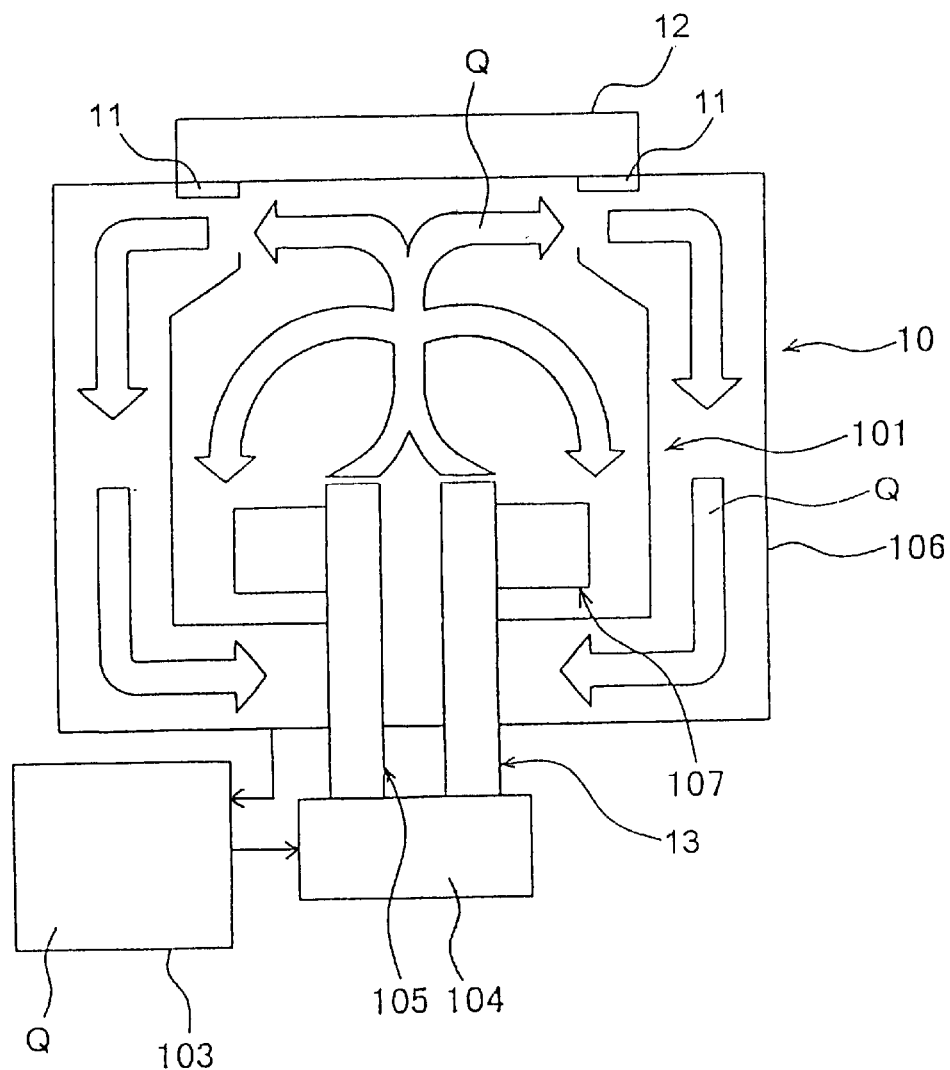
FIG. 1 is a schematic cross sectional view of a plating vessel based on the facedown method of plating.
Figure 2:
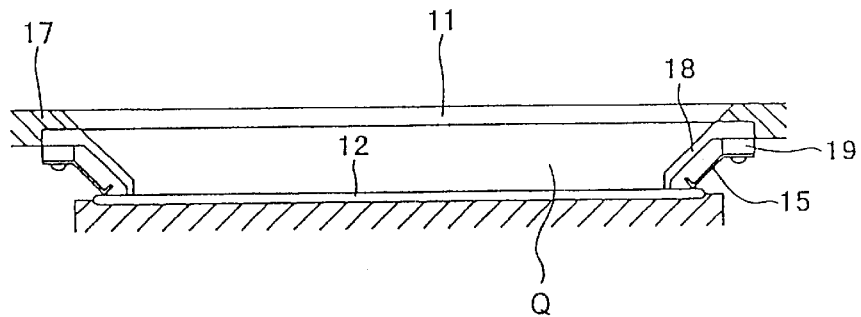
FIG. 2 is a cross sectional view of a portion of the feeding section of a plating jig.
Figure 5:
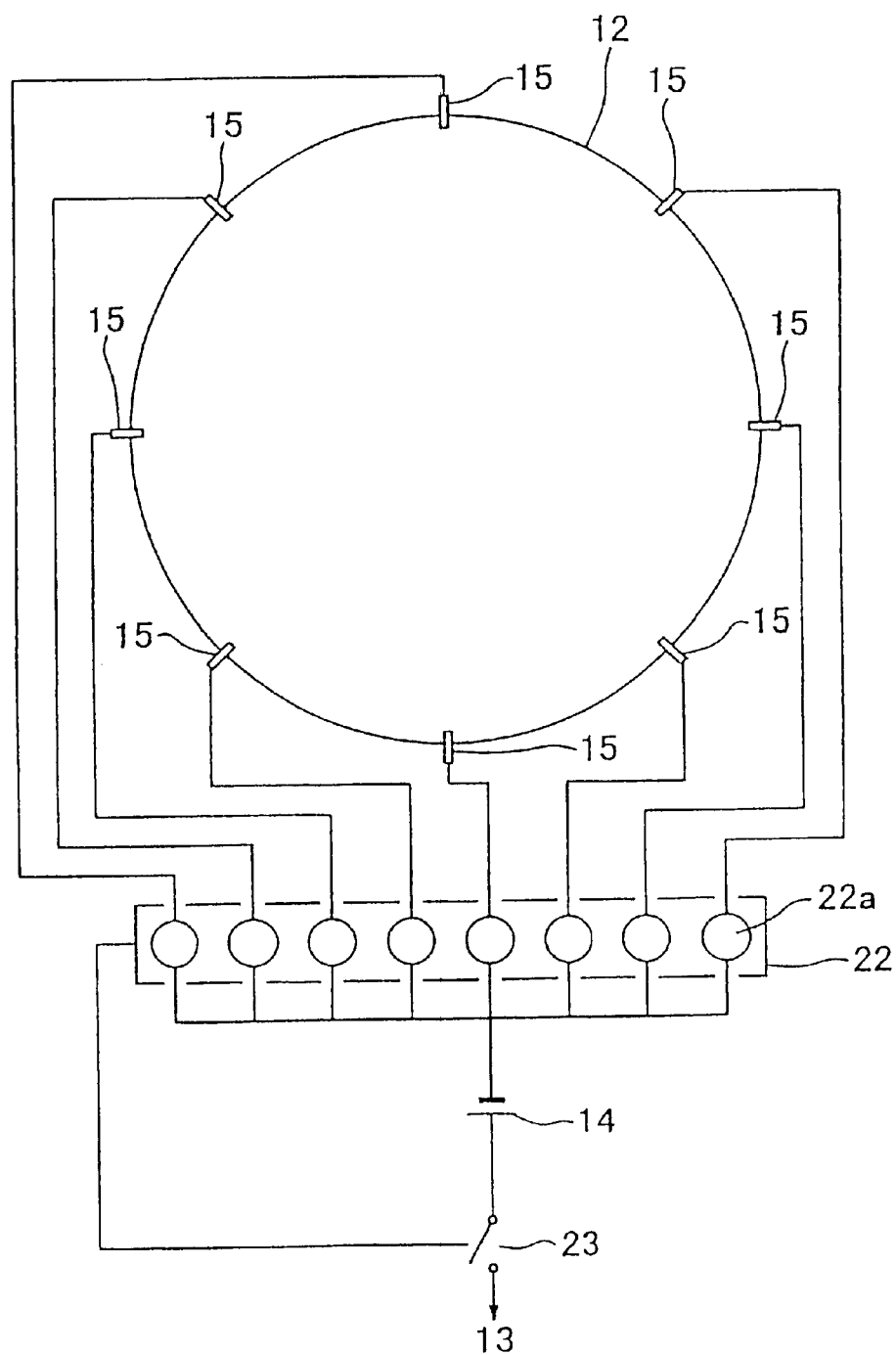
FIG. 5 is a schematic diagram of the conduction detection device of the plating apparatus of the present invention.

Preferred embodiments will be presented with reference to the drawings. FIG. 5 is a schematic diagram of the conduction detection device. A plurality of feeding contacts 15 are in contact with the conductive layer of the substrate 12, such as a wafer, and each feeding contact 15 is connected to respective conduction detection device 22. Here, the structure of the plating apparatus itself is roughly the same as the apparatus shown in FIG. 1, and a plating power supply 14 is connected between the conduction detection device 22 and the anode 13.

At the starting of the plating process for the substrate 12, the conductivity of each feeding contact 15 is checked by the conduction detection device 22, and if there is a contact having incorrect resistively (poor contact between the feeding contact 15 and the conductive layer), the switch 23 is opened, and either the plating power supply 14 is shut off or warning is issued.

Figure 6:
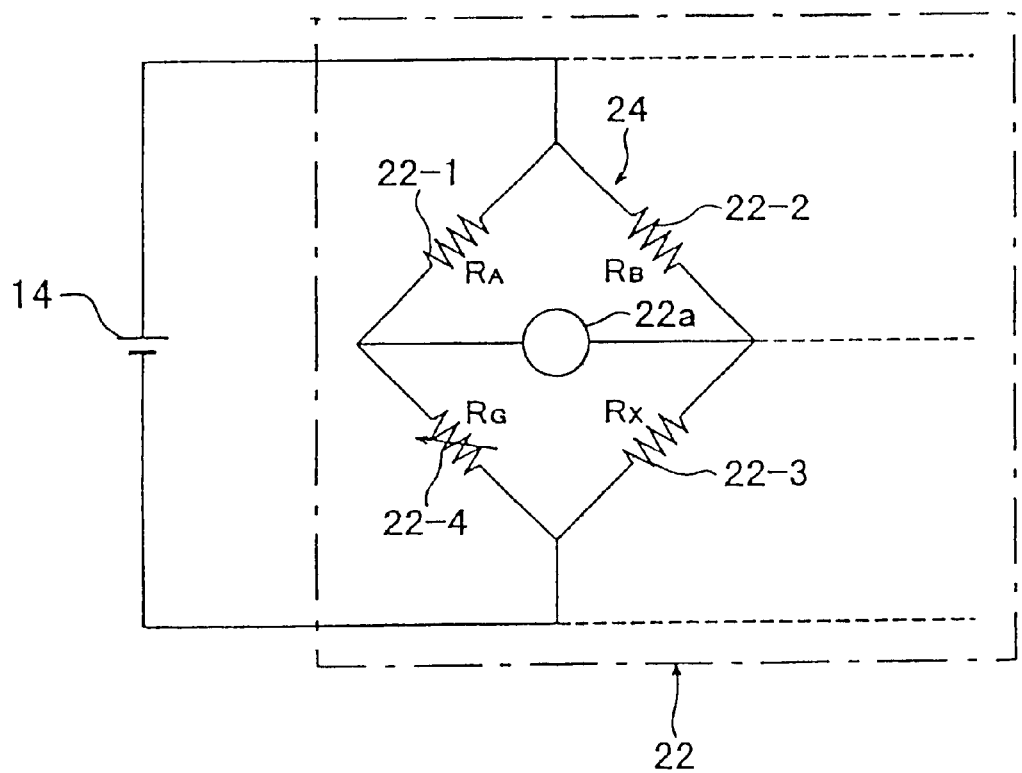
FIG. 6 is a circuit diagram of the conduction detection device of the plating apparatus of the present invention.
Figure 7:
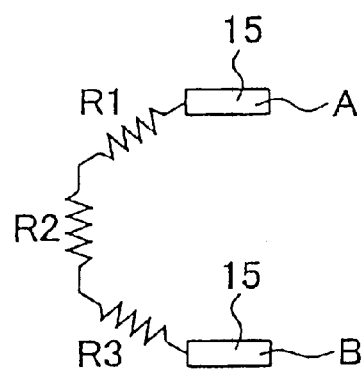
FIG. 7 is an equivalent circuit diagram of the resistance between the feeding contacts.

FIG. 6 shows an example of the structure of the conduction detection device 22. In FIG. 6, the conduction detection device 22 comprises by resistors 22-1, 22-2 having fixed resistance values of $R_A$ and $R_B$; an equivalent resistor 22-3 ($R_X$) which is formed by a current circuit including the contact resistance of each feeding contact 15; and a variable resistor 22-4 having variable resistance value $R_G$ As shown in this diagram, fixed resistors 22-1, 22-2, equivalent resistor of current circuit 22-3, and variable resistor 22-4 are connected in a configuration of a bridge circuit 24, and an ammeter 22a is connected diagonally. The conduction detection device 22 is provided with such bridge circuits 24 as many as feeding contacts 15.

Equivalent resistance $R_X$ is defined to be the normal resistance value through the current circuit that includes normal contact resistance value of conduction of a feeding contact 15. The resistance $R_X$ is obtained by adjustment of the resistance RG of the variable resistor 22-4 so as to null the current flowing in the ammeter 22a, and thereby $R_X$ is given by the following relation.

$$R_X = R_B/R_A \cdot R_G$$

A change in the resistance value $R_X$ in the current circuit connected to each feeding contact 15 is primarily dependent on the contact resistance of each feeding contact 15, which contacts to conductive layer of the substrate. When the conductivity in a feeding contact 15 deteriorates, it causes the contact resistance to be increased, and the bridge circuit 24 becomes unbalanced and a current flows in the ammeter 22a. When the detected current level is higher than a specific value, it is considered to be improper conduction status, and as mentioned earlier, either the plating power is shut off or warning is issued.

As explained above, because of the equipping of the conduction detection device 22, it is possible to check the contacting conditions between each feeding contact 15 and the conductive layer on the substrate 12 attached to the plating jig 11 before starting the plating process or during the plating operation. Therefore, it enables the plating apparatus to prevent non-uniform deposition of plated film caused by improper current conduction through the feeding contacts 15.

In FIGS. 5 and 6, although many bridge circuits containing ammeters 22a are provided corresponding to each of feeding contacts 15, it is allowable to have one bridge circuit 24 having an ammeter 22a so that the conduction states (contact conditions) of each feeding contact 15 can be monitored by switching through the various feeding contacts 15. Also, although an ammeter 22a is included in the bridge circuit 24, it is allowable to use an ammeter 22a in each line by connecting each feeding contact 15 directly, so long as the sensitivity of the ammeter is sufficient to detect the current flowing through the feeding contact 15 in each line.

A method for checking the conduction state between the conductive layer of the substrate 12 and the feeding contact 15 is to measure the resistance value between two feeding contacts 15. The resistance value between two feeding contacts 15 is a combined resistance value R0 which comprises of the contact resistances R1 and R3 between the substrate 12 and the respective feeding contacts 15, and the resistance R2 of the conductive layer itself on the substrate 12. Here, values of the contact resistances R1, R3 are only about several hundred milli-ohms(m$\Omega$), therefore, measurements must be performed with precision.

Figure 8:
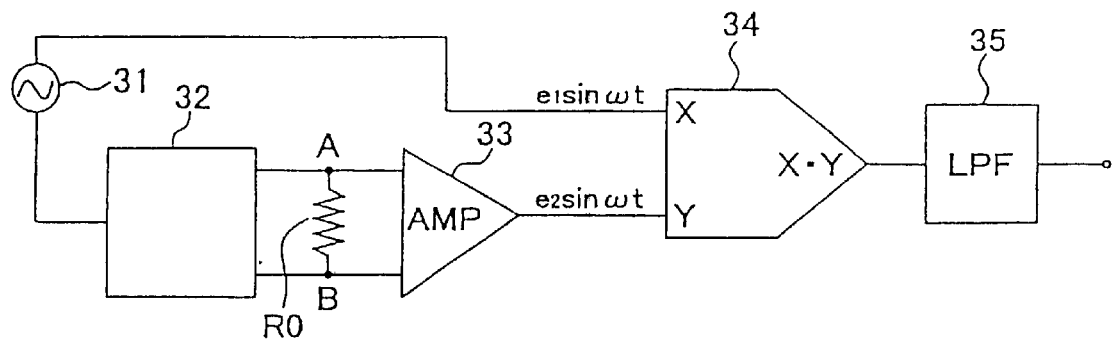
FIG. 8 is a circuit diagram of a basic resistance measuring device to measure the resistance between the feeding contacts.

FIG. 8 is a block diagram of a basic circuitry for determining the combined resistance R0=R1+R2+R3. FIG. 8 shows an alternating current source 31 (oscillation circuit); constant current circuit 32; amplifier 33; synchronous detector 34 (square operation circuit); and low-pass filter 35. An ac voltage $e_1 \sin \omega t$ generated by the ac source 31 is input in one terminal (X) of the synchronous detection circuit 34, and a constant ac current obtained through the constant current circuit 32 is applied through the resistance R0=R1+R2+R3 between two feeding contacts 15 so that the ac voltage $e_2 \sin \omega t$, which is generated across the constant current circuit 32, is amplified in the amplifier 33 and is input in other terminal (Y).

In the synchronous detection circuit 34, ac voltage $e_1 \sin \omega t$ and $e_2 \sin \omega t$ are multiplied to obtain an output voltage:

$(e_1 \cdot e_2 \cdot \sin \omega t^2)/10 = \{(e_1 \cdot e_2)/20\}(1-\cos 2\omega t)$.

This output voltage is passed through the low-pass filter 35 to remove cos2$\omega$t, so that the output from the low-pass filter 35 is a dc voltage whose magnitude is given by:

$(e_1 \cdot e_2)/20$

This dc output voltage is proportional to the combined resistance R0=R1+R2+R3.

Figure 9:
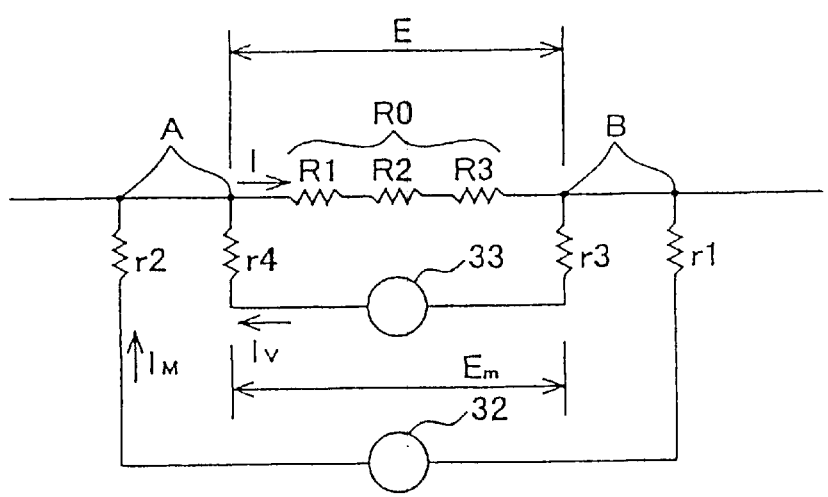
FIG. 9 is an equivalent circuit relating to the resistances of the wiring components and feeding contacts of the circuit shown in FIG. 8.

The combined resistance R0=R1+R2+R3 is usually in a range of 700~900 m$\Omega$ and to measure this low level of resistance accurately, it is necessary to cancel out the wire resistance. FIG. 9 shows an equivalent circuit for explaining the method for canceling the wire resistance. In FIG. 9, r1, r2 show the resistance values of the wiring connecting the constant current circuit 32 to each of the feeding contacts 15, 15 (A, B). And r3, r4 show the resistance values of wiring connecting the amplifier 33 to each of the feeding contacts 15, 15 (A, B) The current flowing in the constant current circuit 32 is designated by $I_M$, the current flowing in the amplifier 33 by $I_V$ and the current flowing in the combined resistance R0=R1+R2+R3 by I.

The input impedance of the amplifier 33 is relatively high at 100 M$\Omega$, therefore, $I_V \ll I_M$ and $I \approx I_M$, therefore, $I_V \approx 0$ and the input voltage $E_M$ in the amplifier 33 is:

$E_M = E - I_V(r3+r4) \approx E$ where E represents the voltage across the combined resistance R0=R1+R2+R3. The value of resistance $R_M$ of the amplifier 33 seen by the output of the constant current circuit 32 is given by:

$R_M = E_M/I_M$ and $R_M \approx E/I = R0$.

Therefore, by connecting the combined resistance R0 of both ends A, B across the constant current circuit 32 and the amplifier 33, as shown in FIG. 9, the wire resistances r1~r4 can be canceled out.

Figure 10:
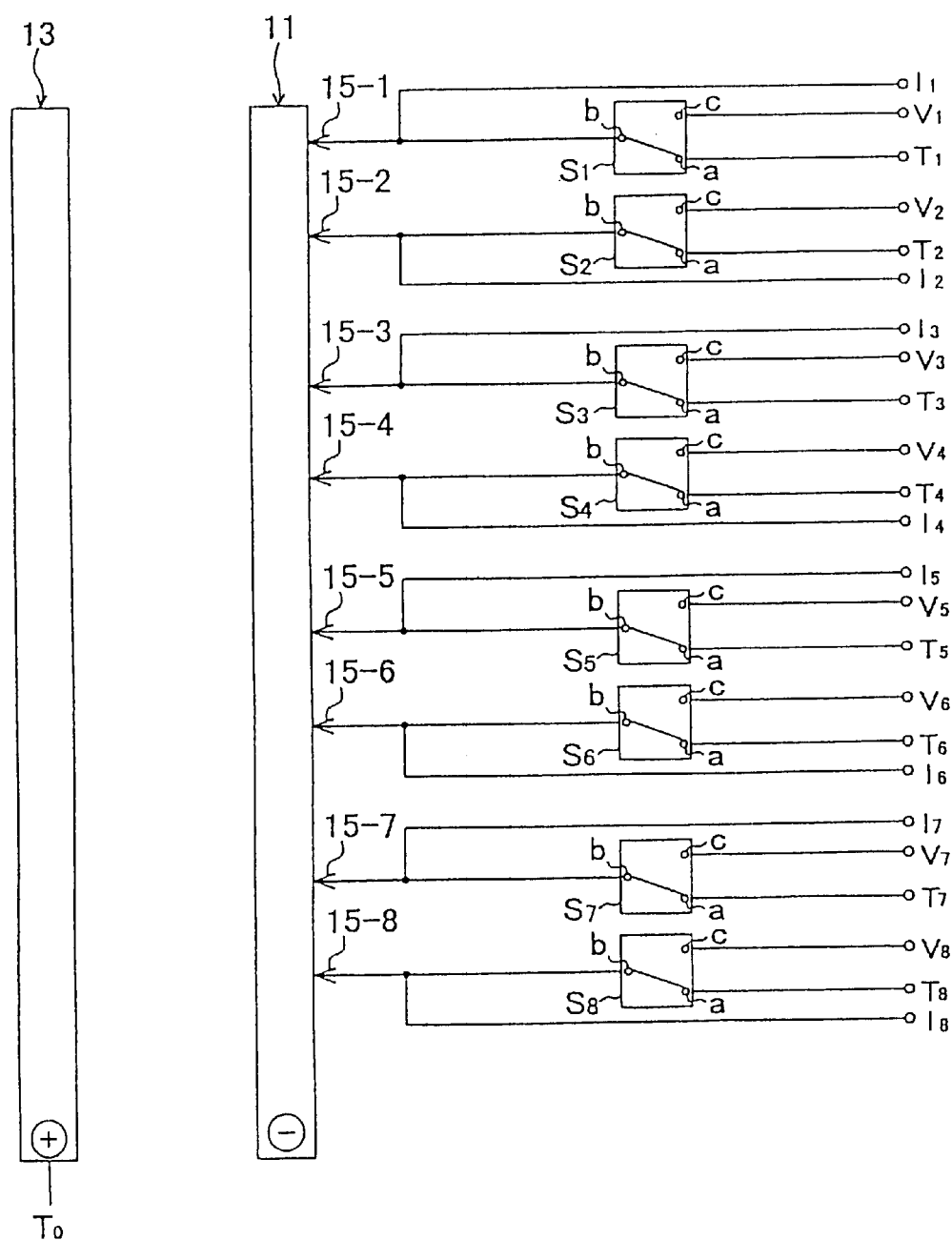
FIG. 10 is a schematic wiring diagram of the circuits for contact resistance measuring and plating feeding for feeding contacts of the plating apparatus.
Figure 11:
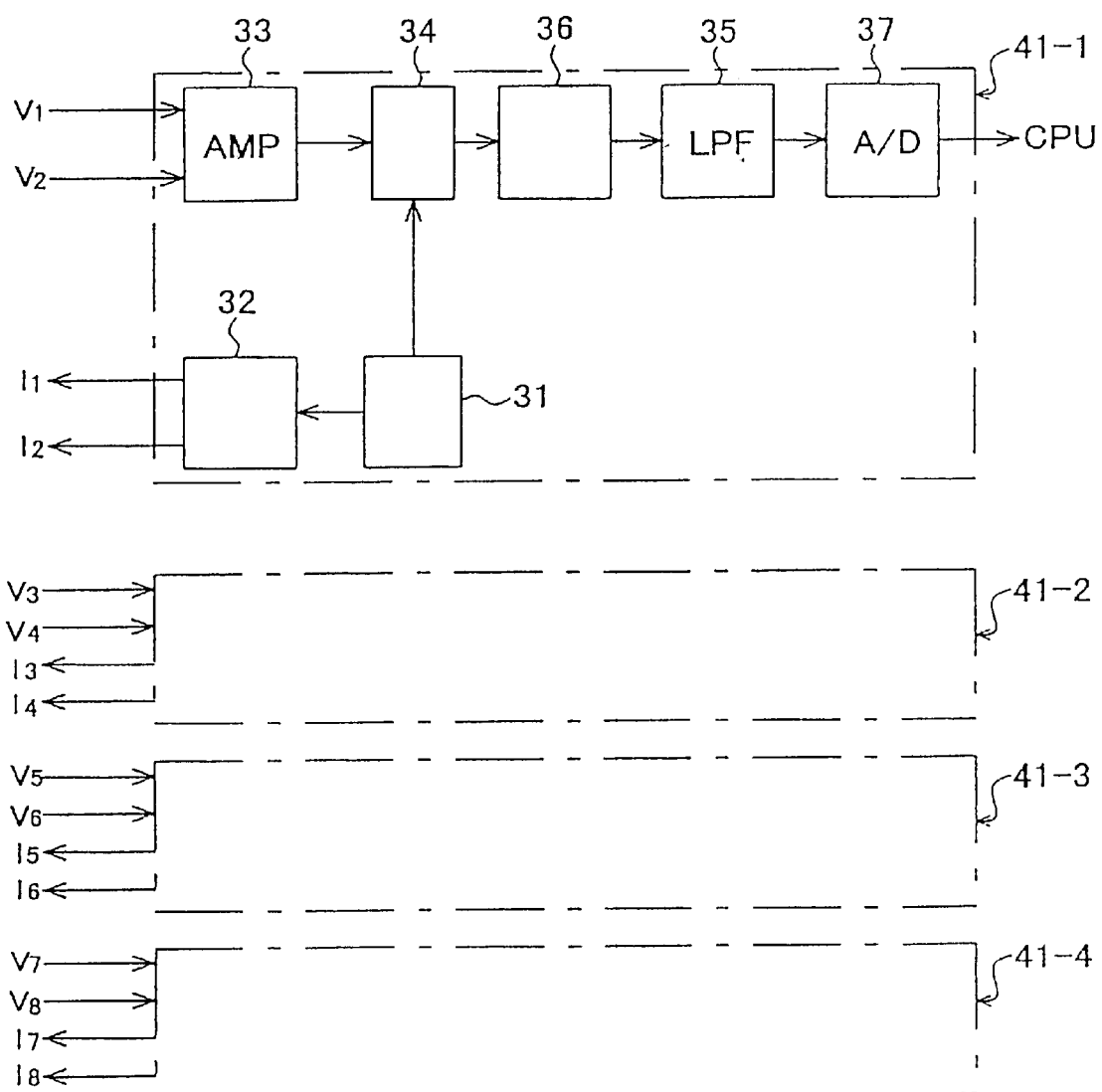
FIG. 11 is a schematic circuit diagram of the contact resistance measuring device.
Figure 12:
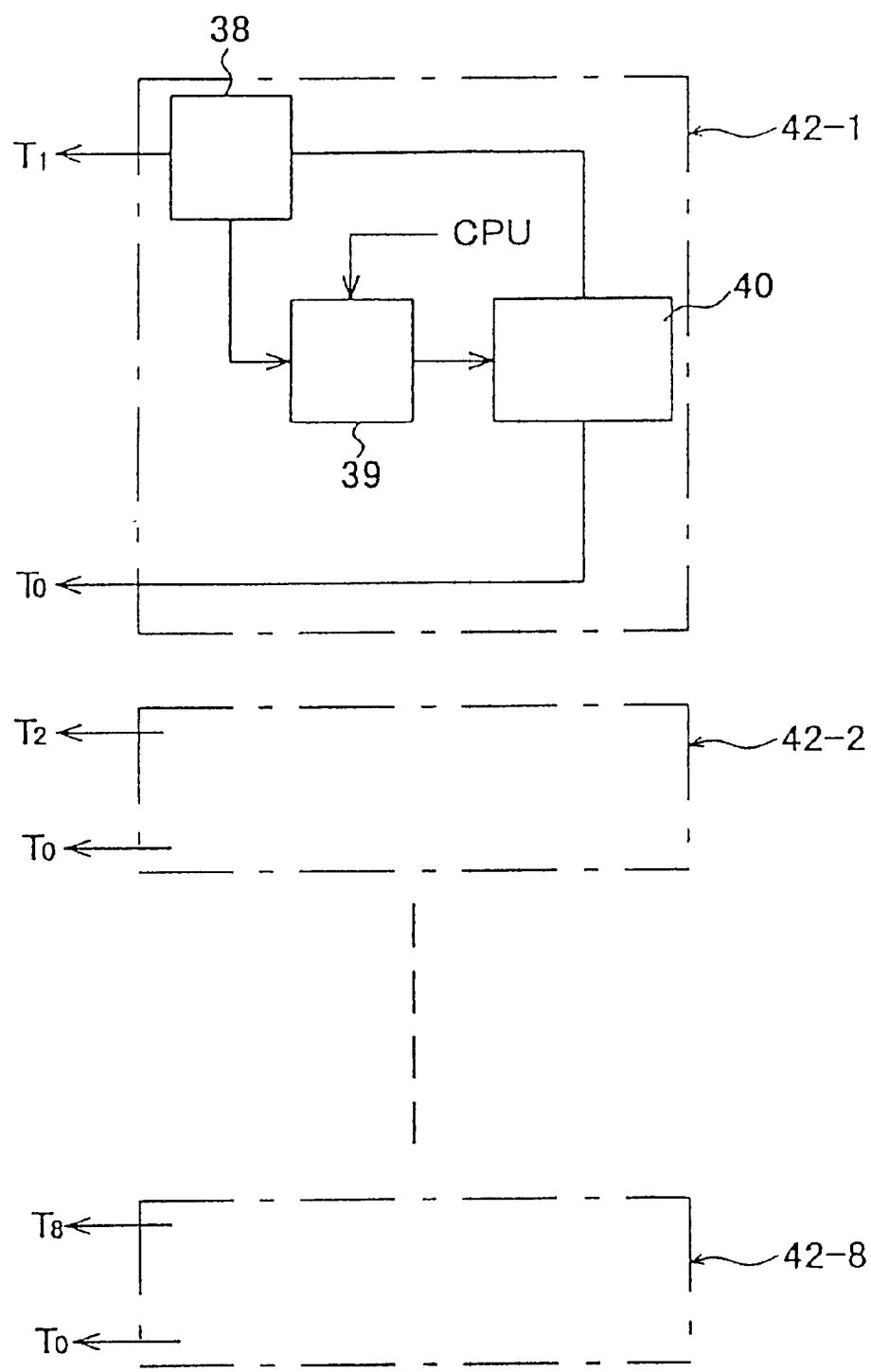
FIG. 12 is a schematic circuit diagram of the plating feeding device.

The plating apparatus based on the resistance measuring method and wiring resistance canceling method described above will be explained with reference to FIGS. 10 through 12. FIG. 10 shows a wiring diagram for contact resistance measurement of feeding contacts and plating feeding. FIG. 11 shows a block diagram of the contact resistance measurement circuit, and FIG. 12 shows a block diagram of the plating feeding device. As shown in FIG. 10, the anode 13 is connected to terminal To, and the feeding contacts 15-1~15-8 are connected directly to respective terminals $I_1$~$I_8$, and are connected to the terminals $V_1$~$V_8$ and to the terminals $T_1$~$T_8$ through the switches $S_1$~$S_8$.

Contact resistance measuring device is comprised by four contact resistance measuring circuits 41-1~41-4 of the same circuit structure, as shown in FIG. 11. The structure of the contact resistance measuring circuit will be explained using circuit 41-1 as the representative circuit. The circuit is comprised by: an ac source (oscillation circuit) 31; constant current circuit 32; amplifier 33; synchronous detector circuit 34; dc amplifier 36; low-pass filter 35; and A/D converter 37. The contact resistance measuring circuit 41-1 has terminals $V_1$, $V_2$, $I_1$, $I_2$, which are connected to the terminals $V_1$, $V_2$, $I_1$, $I_2$, shown in FIG. 10. The contact resistance measuring circuit 41-2 has terminals $V_3$, $V_4$, $I_3$, $I_4$, which are connected to the terminals $V_3$, $V_4$, $I_3$, $I_4$, shown in FIG. 10. The contact resistance measuring circuit 41-3 has terminals $V_5$, $V_6$, $I_5$, $I_6$, which are connected to the terminals $V_5$, $V_6$, $I_5$, $I_6$ shown in FIG. 10. The contact resistance measuring circuit 41-4 has terminals $V_7$, $V_8$, $I_7$, $I_8$, which are connected to the terminals $V_7$, $V_8$, $I_7$, $I_8$ shown in FIG. 10.

Prior to filling the plating vessel 101 (refer to FIG. 1) with the plating solution, the contact resistance measuring apparatus is operated to move the switches $S_1$~$S_4$ to contact point c, so that a constant current flows between each constant current circuit 32 in the contact resistance measuring circuits 41-1~41-4 and between the feeding contacts 15-1 and 15-2, 15-3 and 15-4, 15-5 and 15-6, and 15-7 and 15-8 of the plating jig 11 affixed with the substrate (not shown). A voltage generated across the respective feeding contacts 15 is measured by way of the amplifier 33, synchronous detector 34, DC amplifier 36 and low-pass filter 35. As described above, the wiring resistances are canceled out, and it is possible to obtain measurements of dc voltage output that is proportional to the combined resistance R0=R1+R2+R3.

The dc output from the low-pass filter 35 is converted to digital signals by the A/D converter 37, and the digital signals are sent to CPU. CPU judges whether or not the state of contact between the feeding contact and the conductive layer of the substrate is proper, and if any contact is improper, it notifies which of the contact(s) 15 is(are) improper. Improper contact can result from mechanical reasons so that re-connection can sometimes correct such improper contact 15. Therefore, contacts should be re-connected or readjusted.

When there is no improper contact in any of the feeding contacts 15, i.e., all conduction states are indicated to be proper, switches $S_1$~$S_4$ are switched back to terminal "a", and the plating vessel 10 is filled with the plating solution. Then the plating current is allowed to flow from the plating feeding device shown in FIG. 12.

As shown in FIG. 12, the plating feeding device is comprised by eight plating feeding circuits 42-1~42-8 of the same circuit structure. Each circuit has terminals To and $T_1$~$T_8$, which are connected to the terminals $T_0$ and $T_1$~$T_8$ shown in FIG. 10.

The structure of the plating feeding circuit 42 will be explained using a plating feeding circuit 42-1. The circuit includes a plating current detection circuit 38, a current control circuit 39 and a plating power supply 40, as the representative example. The plating current control circuit 39 selects a value of the plating current according to plating condition commands from the CPU. Then the selected value of the plating current is supplied from the plating power supply 40 to pass through the terminal $T_0$, anode 13, substrate 12 (refer to FIG. 1), each of the feeding contacts 15-1~15-8 of the plating jig 11, each of the switches $S_1$~$S_8$ and each of the terminals $T_1$~$T_8$.

Plating current flowing in individual feeding contacts 15 is detected by the plating current detection circuit 38, and the results are output to the current control circuit 39, which controls the plating power supply 40 so as to maintain the plating current flowing through each of the feeding contacts 15 at the respective selected value. Therefore, by selecting an equal value of the plating current in each of the feeding contacts 15, plating current flowing in each of the feeding contacts 15 will be uniform to form uniform film thickness.

The contact resistance measuring device and plating feeding device described above are merely typical examples of such devices, and are not meant to exclude the use of other types of devices.

Figure 13A:
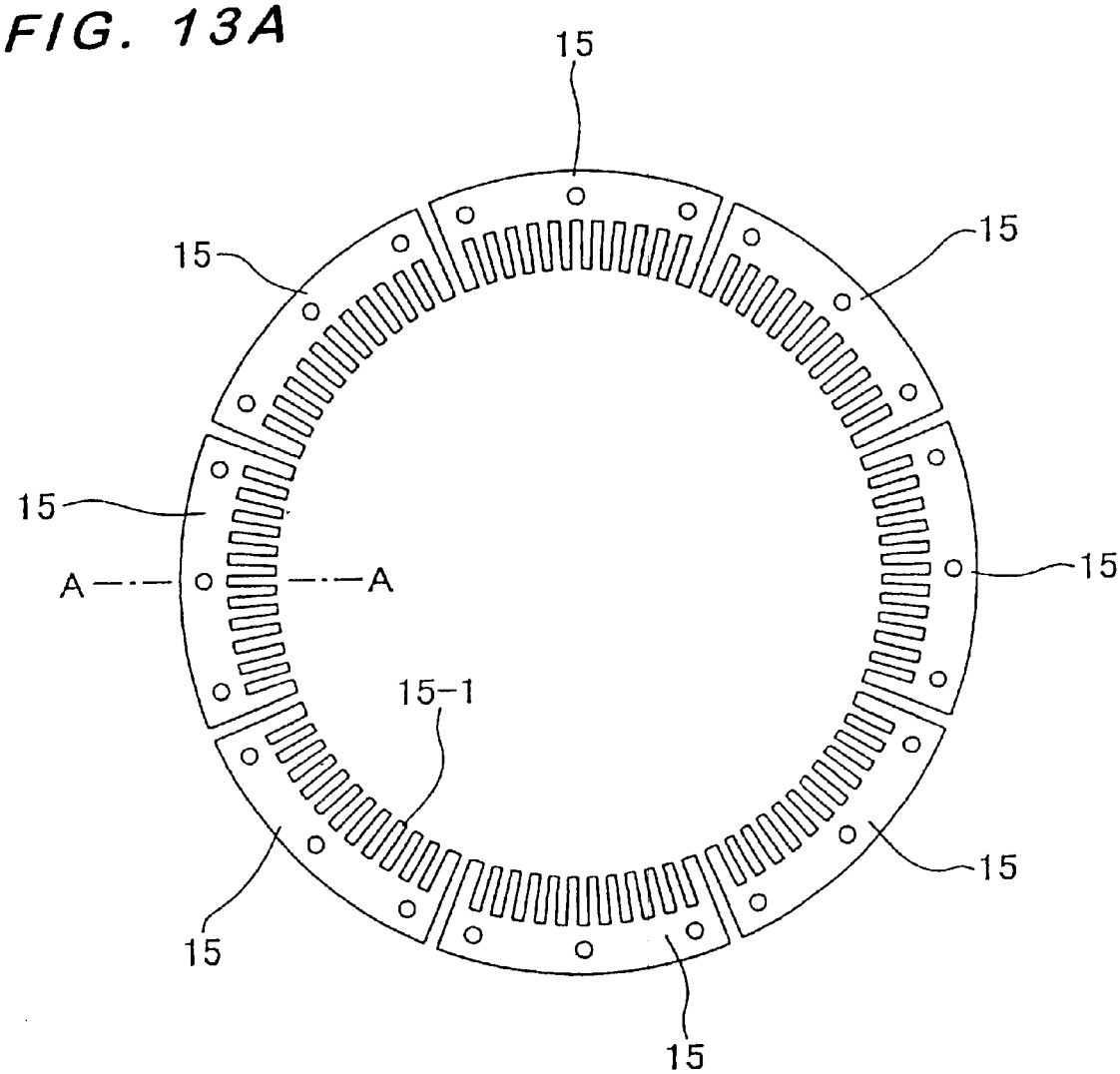
FIGS. 13A and 13B are, respectively, a plan view and a cross sectional view through A—A line of 13A, in which an example of the structure of a feeding contacts provided in the plating jig is shown.
Figure 13B:
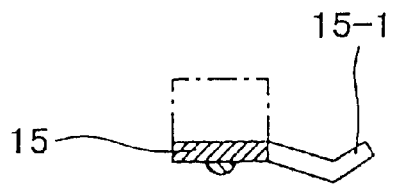

FIGS. 13A and 13B show an example of the structure of the feeding contact, which is provided, in the plating jig of the plating apparatus of the present invention. Each feeding contact 15 has a shape of an arc, and several such segments (eight in this example) are gathered to form a ring shape. Each feeding contact 15 is comprised by several teeth contacts (eight in this example) 15-1 which are fabricated as an integral segment. The feeding contact 15 is made by means of precision strip fabrication techniques from a highly elastic metallic strip having a good electrical conductivity such as phosphorous bronze.

Figure 4:
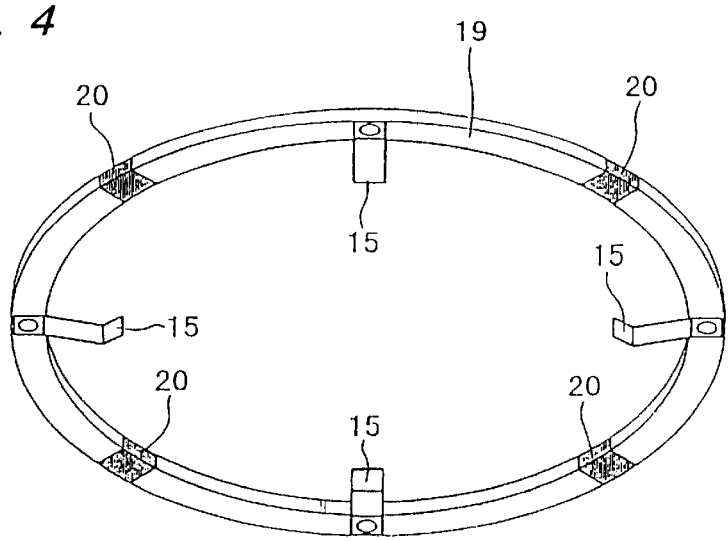
FIG. 4 is a perspective view of the feeding contacts attached to the feeding section of another conventional feeding ring, which is divided into a plurality of electrically isolated sections.

As shown in FIG. 4, the feeding contacts 15 are assembled into feeding sections, which are comprised by a feeding ring 19 separated into feeding sections by insulators 20. The teeth contacts 15-1 are thus made to contact the conductive layer of the substrate 12, and the current flowing through in each feeding contact 15 is thus controlled to distribute uniformly and maintain the plating current at a level. Because of the method of fabricating the feeding contact 15 used in the present invention, it is possible to fabricate finely spaced teeth contacts 15-1 so as to result in producing a uniform plating thickness around each tooth as well as between the teeth contacts 15-1 and 15-1.

Also, because a plurality of feeding contacts 15 are formed into a ring shape, and each contact 15 is divided into finely separated teeth contacts 15-1, the pressure of the contact 15 contacting the conductive layer of the substrate is distributed evenly to prevent non-uniform or unbalancing pressing of the substrate.

Figure 3:
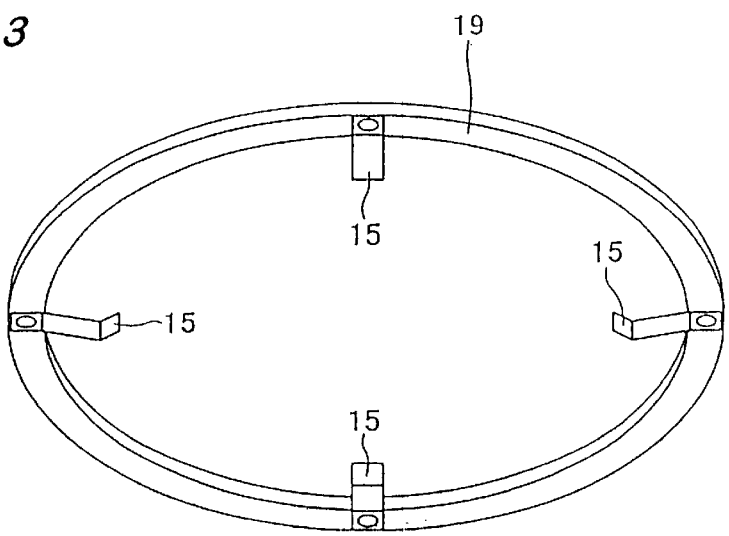
FIG. 3 is a perspective view of the feeding contacts attached to the feeding section of a conventional feeding ring.

Also, it should be noted that, feeding contacts 15 having the teeth contacts 15-1 can be attached to an undivided feeding ring 19, as shown in FIG. 3.

Figure 14:
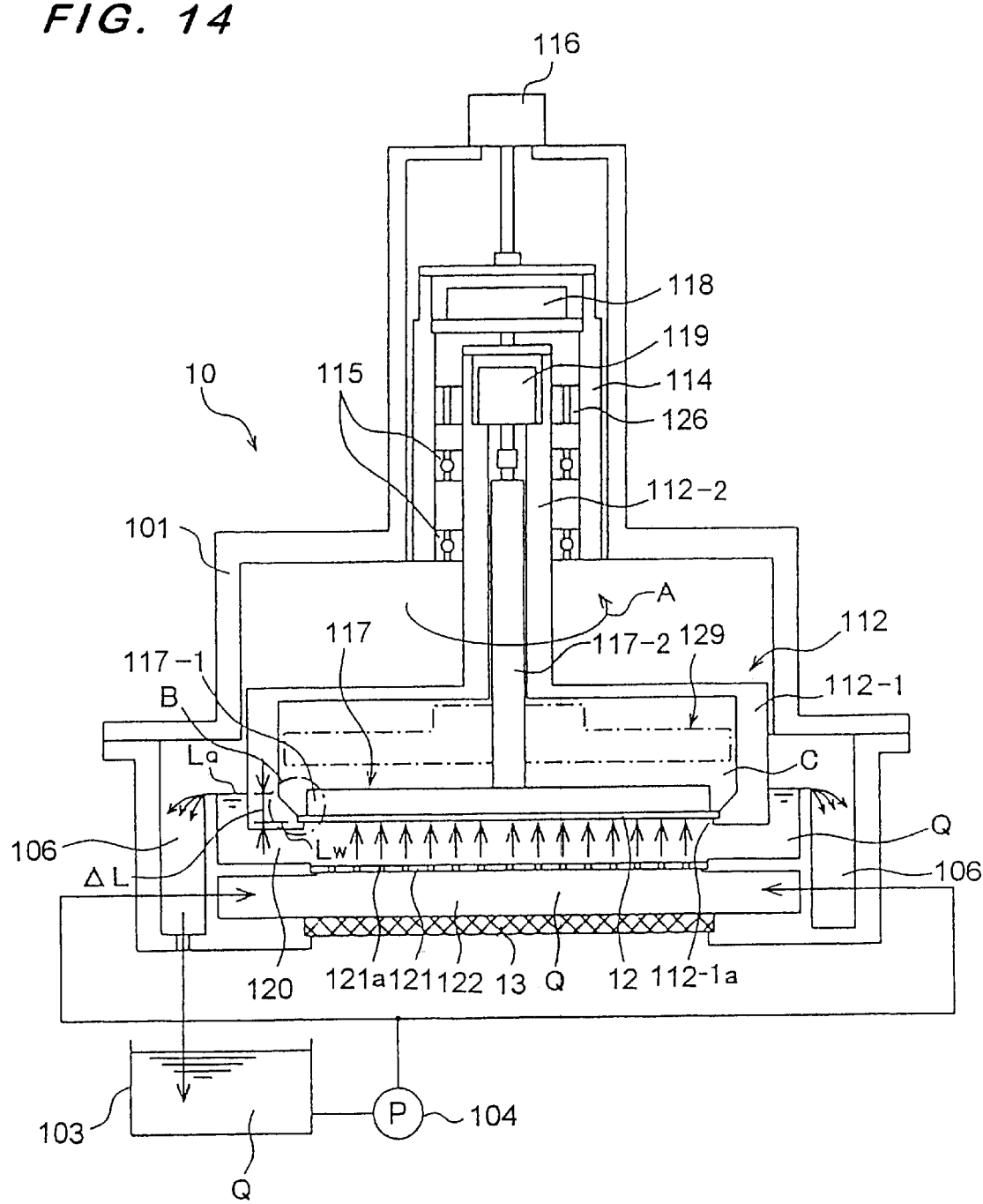
FIG. 14 is a schematic cross sectional view of an example of the structure of the plating vessel of the present invention.

FIG. 14 shows a structure of the plating vessel in the plating apparatus of the present invention. As shown in the diagram, the plating apparatus 10 includes a plating vessel 101 that houses a substrate holder 112. The substrate holder 112 comprises by a holding section 112-1 for holding a substrate 12 such as a semiconductor wafer and a shaft section 112-2 which is freely rotatably supported by bearings 115 disposed on the inner wall of a cylindrical guide member 114. The guide member 114 and the substrate holder 112 are able to be raised or lowered through a certain distance by means of a cylinder 116 disposed at the top region of the plating vessel 101.

The substrate holder 112 can be rotated in the direction shown by an arrow A using the motor 118 to drive the shaft section 112-2, which is disposed in the top interior region of the guide member 114. Also, in the internal space of the substrate holder 112, there is a space C for housing a substrate presser 117 comprised by a pressing section 117-1 and a shaft section 117-2. The substrate presser 117 can be raised or lowered through a certain distance by means of a cylinder 119 disposed at the top region of the shaft section 112-2.

Figure 15:
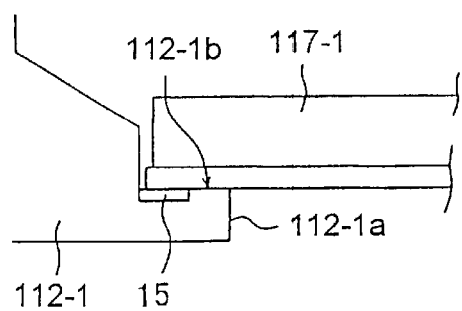
FIG. 15 is an enlarged view of section B shown in FIG. 14.

A hole 112-1a communicating with the space C is disposed at the lower portion of the holding section 112-2 of the substrate holder 112. As shown in FIG. 15, a step section 112-1b is formed above the hole 112-1a for placing the periphery of the substrate 12. The substrate 12 is held between the pressing section 117-1 of the substrate presser 117 and the step section 112-1b, by placing the periphery of the substrate 12 on the step section 112-1b and pressing the upper surface of the substrate 12 with the pressing section 117-1 of the substrate presser 117. The bottom surface of the substrate 12 is the plating surface and is exposed to the hole 112-1a. FIG. 15 shows an enlarged view of a region B indicated in FIG. 14.

Below the holding section 112-1 of the plating vessel 101, i.e., below the plating surface of the substrate 12 exposed to the hole 112-1a, there is a plating chamber 120. A plating solution entry chamber 122 of a flat shape is disposed below the plating chamber 120, which is intervened by a flow guide plate 121 having many holes. A solution recovery trough 106 is disposed on the outer periphery of the plating chamber 120 to collect an overflow of the plating solution Q flowing out from the plating vessel 101.

The plating solution Q collected in the recovery trough 106 is returned to the solution storage tank 103. The plating solution Q in the solution storage tank 103 is introduced into the plating solution entry chamber 122 horizontally from both ends thereof by a pump 104. The plating solution Q introduced into the plating solution entry chamber 122 passes through the holes 121a of the flow guide plate 121 and flows into the plating chamber 120 to form vertical solution streams to jet into the plating chamber 120. The distance between the flow guide plate 121 and the substrate 12 is in a range of 5~15 mm, and the solution streams formed by the holes 121a of the flow guide plate 120 maintain their vertical direction to abut the plating surface of the substrate 12 as fine uniform jet streams of plating solution. Plating solution overflowing from the plating chamber 120 is collected in the solution recovery trough 106 and flows back to the solution storage tank 103. In other words, the flow system is designed so that the plating solution Q circulates between the plating chamber 120 in the plating vessel 101 and the solution storage tank 103.

Liquid level $L_Q$ in the plating chamber 120 is designed to be slightly higher, by a distance $\Delta L$, than the level of the plating surface of the substrate 12 so that the entire plating surface of the substrate 12 is immersed in the plating solution Q.

The step section 112-1b of the holding section 112-1 of the substrate holder 112 has feeding contacts 15 for providing electrical contact to the conductive layer of the substrate 12. The contacts 15 are connected to the cathode of an external plating power supply (not shown) through the electrical brushes 126. The anode 13 is disposed at the bottom of the plating solution entry chamber 122 of the plating vessel 101 so as to oppose the substrate 12, and the anode 13 is connected to the positive terminal of the power supply. A wafer transport slit 129 is disposed on a specific location of the side wall of the plating vessel 101 to enable transfer of substrates to be plated by means of a substrate handling device, for example, a robotic arm.

The plating apparatus described above is operated in the following manner. The substrate holder 112 together with the guide member 114 is raised first to a given height (to match the position of the substrate 12 held by the holding section 112-1 with the transport slit 119) by using the cylinder 116. Together with the above action, the cylinder 119 is operated to raise the substrate presser 117 to a specific height (to match the position of the pressing section 117-1 with the top of the transport slit 129). Then, the substrate 12 is transferred into the space C in the substrate holder 112 so as to be placed on the step section 112-1b by such transport means as a robotic arm with the plating surface facing downwardly. The cylinder 119 is operated so that the bottom surface of the pressing section 117-1 abuts the upper surface of the substrate 12 so that the periphery of the substrate 12 is held between the pressing section 117-1 and the step section 112-1b.

Next, the cylinder 116 operates to lower the substrate holder 112 with the substrate 12, together with the guide section 114 so that the substrate 12 is positioned below the plating solution liquid level $L_Q$ by the amount $\Delta L$ to immerse the whole plating surface in the plating solution Q in the plating chamber 120. At the moment, the motor 118 is started so that the substrate holder 112 and the substrate 12 are rotated together slowly to descend into the solution Q. The plating chamber 120 is filled with the plating solution Q and the solution streams are vertically jetting into the plating chamber 120. In this condition, a specific voltage is applied between the anode 13 and the feeding contacts 15, and plating current is made to flow from the anode 13 to the substrate 12 to deposit a plated film on the substrate 12.

During the plating operation described above, the motor 118 is operated so that the substrate holder 112 and the substrate 12 are both rotated at a slow speed. The speed of rotation is chosen slow so that the rotation action would not disturb the vertical streams of solution Q inside the plating chamber 120, and so that a uniform plating would be obtained on the entire surface of the substrate 12.

When the plating operation is completed, the cylinder 116 is operated to raise the substrate holder 112 together with the substrate 12. When the bottom surface of the holding section 112-1 clears the liquid level $L_Q$, the motor 118 is operated at a high speed to spin-off the plating solution from the plating surface of the substrate 12 as well as from the bottom surface of the holding section 112-1. After spinning the plating solution off, the substrate 12 is raised to the location of the transport slit 129. Then, the cylinder 119 is operated to raise the pressing section 117-1 to release the pressure on the substrate 12 so that the substrate 12 is now just sitting on the step section 112-b of the substrate holder 112. In this condition, transport means such as a robotic arm is operated to enter into the space C in the substrate holder 112 through the transport slit 129 to pick up the substrate 12 to be transported to outside.

By the structure of the plating apparatus as described above, many holes 121a formed on the flow guide plate 121 produce vertical streams of plating solution into the plating chamber 120. Therefore, comparing with the conventional plating apparatus based on the facedown technique in which jet stream of plating solution hits the substrate vertically, traveling distance of the plating solution in the plating chamber is reduced. It results that the vertical dimension of the plating apparatus 10 is reduced, thereby enabling to pile several plating units of plating vessel 10.

It should be noted that, in the above embodiments, electrolytic plating method is used as an example, but the electro-less plating method is also applicable to the plating apparatus without using electrical contact and anode electrode.

Figure 16:
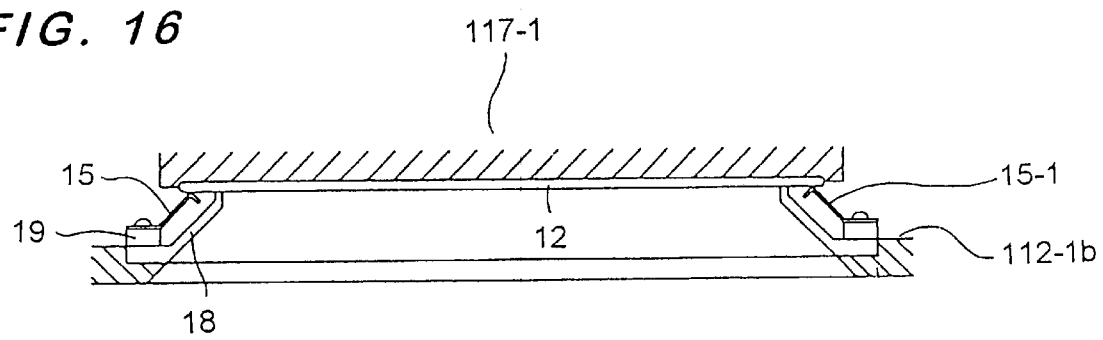
FIG. 16 is a cross sectional view of a portion of the feeding section.

FIG. 16 shows details of a substrate and its support section. The feeding contacts 15 having many teeth contacts 15-1 shown in FIGS. 13A and 13B are fixed on the step section 112-1b of the holding section 112-1. The teeth section 15-1 maintains contact with the conductive layer of the substrate 12 by its elastic force. The feeding section 15 is affixed to the feeding ring 19, which is fixed to the step section 112-1b of the substrate holder. The substrate 12 is held with its plating surface facing down by the pressing section 117-1. The feeding contacts 15 and the outer periphery of the feeding ring 19 is shielded by the packing 18 so as to protect from the plating solution Q. The feeding contact 15 is divided into eight segmental contacts having many teeth sections 15-1 as shown in FIG. 13A, it is possible to apply a uniform electric current on the entire circumferencial surface of the substrate, thereby enabling to deposit a uniform thickness of plating.

Figure 17A:
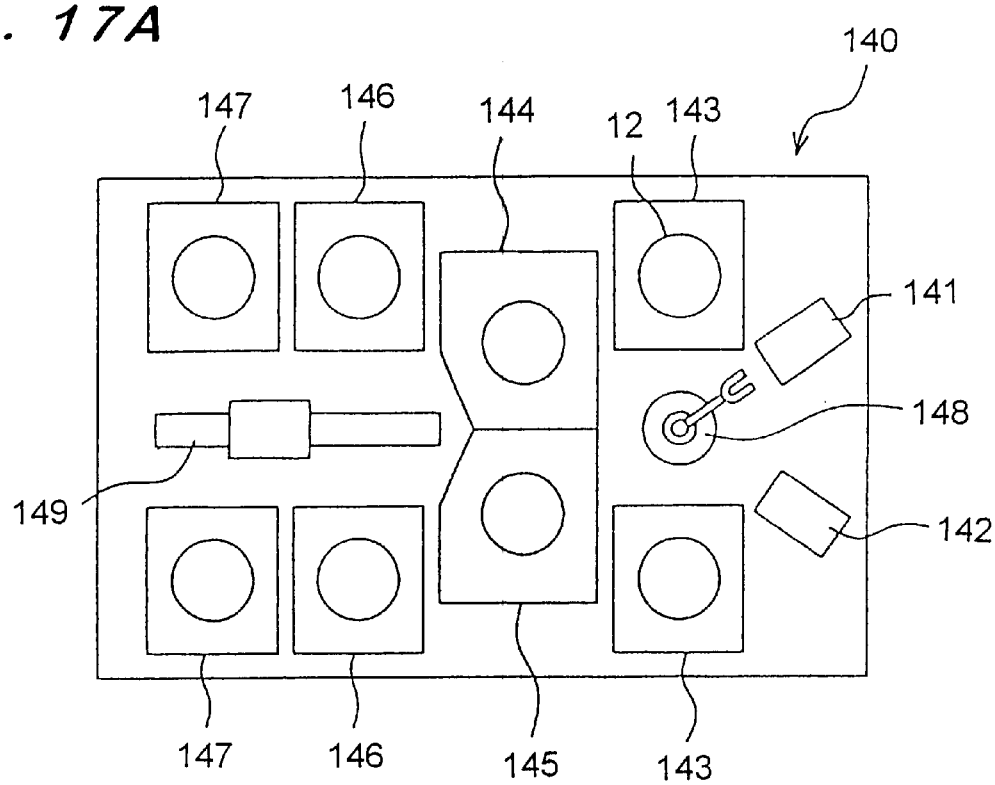
FIGS. 17A and 17B are, respectively, a plan view and a side view showing the overall of the plating apparatus of the present invention.
Figure 17B:
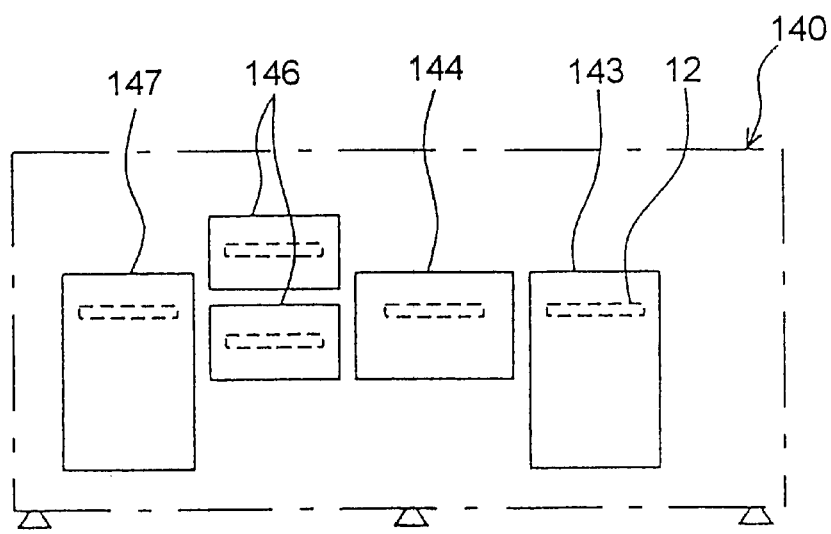

FIGS. 17A and 17B show an overall structure of the plating facility based on the plating apparatus 10 of the present invention. FIG. 17A shows a schematic plan view and FIG. 17B shows a schematic side view. As shown in FIG. 17A, the plating facility 140 comprises: a loading section 141; an unloading section 142; a rinsing and drying section 143; a loading stage 144; a rough washing vessel 145; plating stages 146; pre-treatment vessel 147; a first robot 148; and a second robot 149. Each plating stage 146 is comprised by double stacked plating apparatuses 10, which were shown in FIG. 14. In other words, the overall facility has a total of four plating apparatuses 10. This arrangement has been enabled because the present plating apparatus 10 is shallower than the conventional plating apparatus.

In this plating facility 140, substrates 12 loaded into the cassette in the loading section 141 are removed one by one by the first robot 148, and is transported to the loading stage 144. The second robot 149 transfers the substrate 12 on the loading stage 144 to the pre-treatment vessel 147 to be processed for pre-treatment. Pre-treated substrate 12 is transferred by the second robot 149 to the plating apparatus 10 of the plating stage 146 to be plated. Plated substrate 12 is transported by the second robot 149 to the rough-washing vessel 145 to be quick washed. Roughly washed substrate 12 is transported by the first robot 148 and is further processed in the rinsing and drying vessel 143, and after cleaning and drying, the substrate 12 is transferred to the unloading section 142.

As described above, the plating apparatus 10 of the present invention is comprised by a plating chamber 120 formed between the plating surface of the substrate 12 and the opposing flow guide plate 121 disposed at a specific distance from the plating surface, and the flat solution entry chamber 122 formed below the flow guide plate 121. The plating solution Q is introduced horizontally into the solution entry chamber 122 and streams of the plating solution Q are produced to flow through the numerous flow control holes 121a to generate vertical streams at right angles to the plating surface of the substrate 12. Therefore, compared with the conventional plating apparatus based on the facedown layout, the depth of the plating apparatus can be reduced. Therefore, a number of plating apparatuses 10 can be piled vertically, resulting in a much more compact plating facility.

It should be mentioned that th e plating solution Q might include other metallic plating solutions in addition to the copper sulfate electrolyte used in the present invention.

Industrial Applicability

The present invention relates to a plating apparatus for forming a deposit of fine lines of plated film of a metallic substance, such as copper, on a semiconductor substrate. Copper wiring has an advantage of higher current capacity compared with aluminum wiring. Therefore, the plating apparatus is particularly useful for fabricating semiconductor devices, which require very fine interconnection wiring.

What is claimed is:

1. An electroplating apparatus for electroplating a substrate having a plating surface with a conductive layer thereon, said electroplating apparatus comprising:
    a plating vessel having an electrode, wherein said electrode is in opposition to a position for the substrate;
    a plating jig having a plurality of feeding contacts, said plurality of feeding contacts being operable to impress a specific voltage between said electrode and the conductive layer on the plating surface of the substrate, thereby causing a plating current to flow from said electrode to the substrate through said plurality of feeding contacts to allow a plated film to be deposited on the substrate; and
    a conduction detection device comprising a plurality of bridge devices, each of said plurality of bridge devices being connected to one of said plurality of feeding contacts to detect electrical conductivity between each of said plurality of feeding contacts on said plating jig and the conductive layer on the substrate.

2. An electroplating apparatus as claimed in claim 1, wherein said conduction detection deceive comprises a plating current conduction device operable to detect a flow of electrical current through each of said plurality of feeding contacts, thereby detecting the electrical conductivity of said plurality of feeding contacts.

3. An electroplating apparatus as claimed in claim 1, wherein said conduction detection device comprises a contact resistance measuring device operable to measure contact resistance between the conductive layer on the plating surface of the substrate and each of said plurality of feeding contacts, thereby detecting the electrical conductivity of said plurality of feeding contacts.

4. An electroplating apparatus as claimed in claim 3, wherein said contact resistance measuring device comprises:
    a constant current circuit;
    an alternating current oscillator operable to supply an alternating current to said plurality of feeding contacts via said constant current circuit, thereby generating a first ac voltage between said plurality of feeding contacts;
    a synchronous detector circuit having first and second terminals, said first terminal operable to receive the first ac voltage generated between said plurality of feeding contacts, said second terminal operable to receive a second ac voltage generated at said alternating current oscillator, and said synchronous detector circuit being operable to multiply the first ac voltage and the sencond ac voltage and to output resultant signals; and
    a low-pass filter operable to filter the resultant signals from said synchronous detector circuit and to output a direct current output that is proportional to a resistance value between said plurality of feeding contacts.

5. An electroplating apparatus for electroplating a substrate having a plating surface with a conductive layer thereon, said electroplating apparatus comprising:
    a plating vessel having an electrode, wherein said electrode is in opposition to a position for the substrate;
    a plating jig having a plurality of feeding contacts, said plurality of feeding contacts being operable to impress a specific voltage between said electrode and the conductive layer on the plating surface of the substrate, thereby causing a plating current to flow from said electrode to the substrate through said plurality of feeding contacts to allow a plated film to be deposited on the substrate; and
    a conduction detection device comprising a plurality of bridge devices, each of said plurality of bridge devices being connected to one of said plurality of feeding contacts to detect electrical conductivity between each of said plurality of feeding contacts on said plating jig and the conductive layer on the substrate,
    wherein said conduction detection device comprises a contact resistance measuring device operable to measure contact resistance between the conductive layer on the plating surface of the substrate and each of said plurality of feeding contacts, thereby detecting the electrical conductivity of said plurality of feeding contacts, and
    wherein said contact resistance measuring device comprises a resistance cancelling means for cancelling resistance values of wiring associated with said contact resistance measuring device to eliminate effects of the resistance values of the wiring on measured results.

6. An electroplating apparatus as claimed in claim 1, further comprising:
    a plating current detection device operable to detect the plating current flowing through said plurality of feeding contacts; and
    a plating current control device operable to control the plating currents flowing through said plurality of feeding contacts to be uniform based on results provided by said plating current detection device.

7. An electroplating apparatus as claimed in claim 1, wherein each of said plurality of feeding contacts has teeth contacts operable to abut the conductive layer on the plating surface of the substrate.

8. An electroplating apparatus for electroplating a substrate having a plating surface with a conductive layer thereon, said electroplating apparatus comprising:
    a plating vessel having an electrode, wherein said electrode is in opposition to a position for the substrate;
    a plating jig having a plurality of feeding contacts, said plurality of feeding contacts being operable to impress a specific voltage between said electrode and the conductive layer on the plating surface of the substrate, thereby causing a plating current to flow from said electrode to the substrate through said plurality of feeding contacts to allow a plated film to be deposited on the substrate; and
    a conduction detection device comprising a plurality of bridge devices, each of said plurality of bridge devices being connected to one of said plurality of feeding contacts to detect electrical conductivity between each of said plurality of feeding contacts on said plating jig and the conductive layer on the substrate, wherein said conduction detection device comprises a contact resistance measuring device operable to measure contact resistance between the conductive layer on the plating surface of the substrate and each of said plurality of feeding contacts, thereby detecting the electrical conductivity of said plurality of feeding contacts, and wherein said contact resistance measuring device comprises a constant current circuit, an alternating current oscillator operable to supply an alternating current to said plurality of feeding contacts via said constant current circuit, thereby generating a first ac voltage between said plurality of feeding contacts, a synchronous detector circuit having first and second terminals, said first terminal operable to receive the first ac voltage generated between said plurality of feeding contacts, said second terminal operable to receive a second ac voltage generated at said alternating current oscillator, and said synchronous detector circuit being operable to multiply the first ac voltage and the second ac voltage and to output resultant signals, a low-pass filter operable to filter the resultant signals from said synchronous detector circuit and to output a direct current output that is proportional to a resistance value between said plurality of feeding contacts, and resistance cancelling means for cancelling resistance values of wiring associated with said contact resistance measuring device to eliminate effects of the resistance values of the wiring on measured results.

9. An electroplating apparatus for electroplating a substrate having a plating surface with a conductive layer thereon, said electroplating apparatus comprising:

a plating vessel having an electrode and a substrate holder for holding the substrate;

a flow guide plate having a plurality of holes disposed between the substrate and said electrode for dividing said plating vessel into a plating chamber and a plating solution entry chamber, said plating chamber defined between the substrate and said flow guide plate, said plating solution entry chamber defined between said flow guide plate and said electrode;

a plating jig having a plurality of feeding contacts, said plurality of feeding contacts being operable to flow a plating current to allow a plated film to be deposited on the substrate; and a conduction detection device being operable to detect electrical conductivity between each of said plurality of feeding contacts on said plating jig and the conductive layer on the substrate, wherein plating solution flows into said plating solution entry chamber and changes a direction of flow perpendicular into said plating chamber toward the substrate through the plurality of holes in said flow guide plate.

10. An electroplating apparatus as claimed in claim 9, further comprising a feeding ring, wherein said plurality of feeding contacts are attached to said feeding ring.

11. An electroplating apparatus as claimed in claim 9, wherein each of said plurality of feeding contacts is divided into finely separated teeth contacts for connecting to the conductive layer on the substrate.

12. An electroplating apparatus as claimed in claim 9, wherein each of said plurality of feeding contacts is connected to a resistor.

13. An electroplating apparatus as claimed in claim 1, wherein said substrate holder is rotatable by a motor.

14. An electroplating apparatus for electroplating a substrate having a plating surface with a conductive layer thereon, said electroplating apparatus comprising:

a plating vessel having an electrode, wherein said electrode is in opposition to a position for the substrate;

a plating jig having a plurality of feeding contacts, said plurality of feeding contacts being operable to impress a voltage between said electrode and the conductive layer on the plating surface of the substrate, thereby causing a plating current to flow from said electrode to the substrate through said plurality of feeding contacts to allow a plated film to be deposited on the substrate; and a conduction detection device being operable to detect electrical conductivity between each of said plurality of feeding contacts on said plating jug and the conductive layer on the substrate, wherein when said conduction detection device detects a poor contact, said conduction detection device is operable to cause a power supply to be shut off of a warning to be issued.

15. An electroplating apparatus for electroplating a substrate having a plating surface with a conductive layer thereon, said electroplating apparatus comprising:

a plating vessel having an electrode, wherein said electrode is in opposition to a position for the substrate;

a plating jig having a plurality of feeding contacts, said plurality of feeding contacts being. operable to impress a voltage between said electrode and the conductive layer on the plating surface of the substrate, thereby causing a plating current to flow from said electrode to the substrate through said plurality of feeding contacts to allow a plated film to be deposited on the substrate; and a conduction detection device being operable to detect electrical conductivity between each of said plurality of feeding contacts on said plating jig and the conductive layer on the substrate, wherein said conduction detection device comprises a resistance bridge circuit.

16. An electroplating apparatus as claimed in claim 15, wherein said resistance bridge circuit is connected to each of said plurality of feeding contacts.

17. An electroplating apparatus as claimed in claim 15, further comprising aswitching circuit, wherein said resistance bridge circuit and said switching circuit detect a conduction state of each of said plurality of feeding contacts by switching.

18. An electroplating apparatus for electroplating a substrate having a plating surface with a conductive layer thereon, said electroplating apparatus comprising:

a plating vessel having an electrode, wherein said electrode is in opposition to a position for the substrate;

a plating jig having a plurality of feeding contacts, said plurality of feeding contacts being operable to impress a voltage between said electrode and the conductive layer on the plating surface of the substrate, thereby causing a plating current to flow from said electrode to the substrate through said plurality of feeding contacts to allow a plated film to be deposited on the substrate; and a conduction detection device being operable to detect electrical conductivity between each of said plurality of feeding contacts on said plating jig and the conductive layer on the substrate, wherein said conduction detection device includes a CPU.

19. An electroplating apparatus as claimed in claim 18, wherein said CPU judges a state of contact between each of said plurality of feeding contacts and the conductive layer of the substrate.

20. An electroplating apparatus for electroplating a substrate having a plating surface with a conductive layer thereon, said electroplating apparatus comprising:

a plating vessel having an electrode, wherein said electrode is in opposition to a position for the substrate;

a plating jig having a plurality of feeding contacts, said plurality of feeding contacts being operable to impress a voltage between said electrode and the conductive layer on the plating surface of the substrate, thereby causing a plating current to flow from said electrode to the substrate through said plurality of feeding contacts to allow a plated film to be deposited on the substrate; and a conduction detection device being operable to detect electrical conductivity between each of said plurality of feeding contacts on said plating jig and the conductive layer on the substrate, wherein said conduction detection device includes a CPU, said CPU being operable to provide notification of a place of poor contact of said plurality of feeding contacts.

21. An electroplating apparatus for electroplating a substrate having a plating surface with a conductive layer thereon, said electroplating apparatus comprising:

a plating vessel having an electrode, wherein said electrode is in opposition to a position for the substrate;

a plating jig having a plurality of feeding contacts, said plurality of feeding contacts being operable to impress a voltage between said electrode and the conductive layer on the plating surface of the substrate, thereby causing a plating current to flow from said electrode to the substrate through said plurality of feeding contacts to allow a plated film to be deposited on the substrate; and a conduction detection device being operable to detect electrical conductivity between each of said plurality of feeding contacts on said plating jig and the conductive layer on the substrate, wherein each of said plurality of feeding contacts is connected to a power supply via said conduction detection device.

22. An electroplating apparatus as claimed in claim 21, wherein each of said plurality of feeding contacts has teeth contacts operable to abut the conductive layer on the plating surface of the substrate.

23. An electroplating apparatus for electroplating a substrate having a plating surface with a conductive layer thereon, said electroplating apparatus comprising:

a plating vessel having an electrode, wherein said electrode is in opposition to a position for the substrate;

a plating jig having a plurality of feeding contacts, said plurality of feeding contacts being operable to impress a voltage between said electrode and the conductive layer on the plating surface of the substrate, thereby causing a plating current to flow from said electrode to the substrate through said plurality of feeding contacts to allow a plated film to be deposited on the substrate; and a conduction detection device being operable to detect electrical conductivity between each of said plurality of feeding contacts on said plating jig and the conductive layer on the substrate, wherein each of said plurality of feeding contacts is connected to a power supply via said conduction detection device, and wherein when said conduction detection device detects a poor contact, said conduction detection device is operable to cause a power supply to be shut off or a warning to be issued.

24. An electroplating apparatus as claimed in claim 21, wherein said conduction detection device comprises a resistance bridge circuit.

25. An electroplating apparatus as claimed in claim 24, wherein said resistance bridge circuit is connected to each of said plurality of feeding contacts.

26. An electroplating apparatus as claimed in claim 24, further comprising a switching circuit, wherein said resistance bridge circuit and said switching circuit detect a conduction state of each of said plurality of feeding contacts by switching.

27. An electroplating apparatus as claimed in claim 21, wherein said conduction detection device includes a CPU.

28. An electroplating apparatus as claimed in claim 27, wherein said CPU judges a state of contact between each of said plurality of feeding contacts and the conductive layer of the substrate.

29. An electroplating apparatus for electroplating a substrate having a plating surface with a conductive layer thereon, said electroplating apparatus comprising:

a plating vessel having an electrode, wherein said electrode is in opposition to a position for the substrate;

a plating jig having a plurality of feeding contacts, said plurality of feeding contacts being operable to impress a voltage between said electrode and the conductive layer on the plating surface of the substrate, thereby causing a plating current to flow from said electrode to the substrate through said plurality of feeding contacts to allow a plated film to be deposited on the substrate; and a conduction detection device being operable to detect electrical conductivity between each of said plurality of feeding contacts on said plating jig and the conductive layer on the substrate, wherein each of said plurality of feeding contacts is connected to a power supply via said conduction detection device, and wherein said conduction detection device includes a CPU, said CPU being operable to judge a state of contact between each of said plurality of feeding contacts and the conductive layer of the substrate and being operable to provide notification of a place of poor contact of said plurality of feeding contacts.

* * * * *

UNITED STATES PATENT AND TRADEMARK OFFICE
CERTIFICATE OF CORRECTION

PATENT NO.     : 6,517,689 B1                                        Page 1 of 1
DATED          : February 11, 2003
INVENTOR(S)    : Akihisa Hongo et al.

It is certified that error appears in the above-identified patent and that said Letters Patent is hereby corrected as shown below:

<u>Column 14,</u>
Line 1, please change "as claimed in claim 1" to -- as claimed in claim 9 --.

Signed and Sealed this

Tenth Day of June, 2003

JAMES E. ROGAN
*Director of the United States Patent and Trademark Office*